(12) United States Patent
Wu et al.

(10) Patent No.: US 12,557,431 B2
(45) Date of Patent: Feb. 17, 2026

(54) PHOTODETECTORS WITH A LIGHT-ABSORBING LAYER AT LEAST PARTIALLY WRAPPED ABOUT A WAVEGUIDE CORE

(71) Applicant: GlobalFoundries U.S. Inc., Malta, NY (US)

(72) Inventors: Zhuojie Wu, Port Chester, NY (US); Yusheng Bian, Ballston Lake, NY (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 405 days.

(21) Appl. No.: 18/134,100

(22) Filed: Apr. 13, 2023

(65) Prior Publication Data

US 2024/0347652 A1 Oct. 17, 2024

(51) Int. Cl.
*H10F 77/40* (2025.01)
*H10F 71/00* (2025.01)
*H10F 77/20* (2025.01)

(52) U.S. Cl.
CPC ....... *H10F 77/413* (2025.01); *H10F 71/1212* (2025.01); *H10F 77/206* (2025.01)

(58) Field of Classification Search
CPC .......................... H10F 77/413; G02B 6/4204
See application file for complete search history.

(56) References Cited

U.S. PATENT DOCUMENTS

| 7,120,350 | B2 | 10/2006 | Block et al. | |
| 7,397,101 | B1 * | 7/2008 | Masini | H10F 30/223 |
| | | | | 257/656 |
| 8,290,325 | B2 * | 10/2012 | Reshotko | H10F 30/223 |
| | | | | 385/129 |
| 8,873,901 | B2 * | 10/2014 | Kang | G02B 6/124 |
| | | | | 385/14 |
| 10,910,503 | B1 | 2/2021 | Bian et al. | |
| 11,199,672 | B1 | 12/2021 | Holt et al. | |
| 2022/0291126 | A1 | 9/2022 | Jain et al. | |

OTHER PUBLICATIONS

Hu, Xiao & Wu et al. (2021). "High-speed and high-power germanium photodetector with a lateral silicon nitride waveguide." Photonics Research. 9. 749. 10.1364/PRJ.417601.
(Continued)

*Primary Examiner* — Matthew L Reames
(74) *Attorney, Agent, or Firm* — Thompson Hine LLP; Anthony Canale

(57) ABSTRACT

Structures including a photodetector and methods of forming a structure including a photodetector. The structure comprises a semiconductor layer comprising a crystalline semiconductor material, a waveguide core including a first sidewall and a second sidewall, and a photodetector including a light-absorbing layer, an anode, and a cathode. The light-absorbing layer includes a first portion and a second portion that are disposed on the semiconductor layer. The first portion of the light-absorbing layer is adjacent to the first sidewall of the waveguide core, and the second portion of the light-absorbing layer is adjacent to the second sidewall of the waveguide core.

20 Claims, 7 Drawing Sheets

(56) References Cited

OTHER PUBLICATIONS

Lin, Yiding & Yong et al. (2022). "Monolithically integrated, broadband, high-efficiency silicon nitride-on-silicon waveguide photodetectors in a visible-light integrated photonics platform." Nature Communications. 13. 10.1038/s41467-022-34100-3.

S. Lischke et al., "Silicon nitride waveguide coupled 67+ GHz Ge photodiode for non-SOI PIC and ePIC platforms," 2019 IEEE International Electron Devices Meeting (IEDM), San Francisco, CA, USA, 2019, pp. 33.2.1-33.2.4, doi: 10.1109/IEDM19573.2019.8993651.

M. R. Reshotko, B. A. Block, B. Jin and P. Chang, "Waveguide coupled Ge-on-oxide photodetectors for integrated optical links," 2008 5th IEEE International Conference on Group IV Photonics, Sorrento, Italy, 2008, pp. 182-184, doi: 10.1109/GROUP4.2008.4638138.

I. Young et al., "Optical I/O technology for tera-scale computing," 2009 IEEE International Solid-State Circuits Conference—Digest of Technical Papers, San Francisco, CA, USA, 2009, pp. 468-469,469a, doi: 10.1109/ISSCC.2009.4977511.

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611, doi: 10.1109/JSTQE.2019.2908790.

M. Rakowski et al., "45nm CMOS—Silicon Photonics Monolithic Technology (45CLO) for next-generation, low power and high speed optical interconnects," in Optical Fiber Communication Conference (OFC) 2020, OSA Technical Digest (Optica Publishing Group, 2020), paper T3H.3.

Y. Bian et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optica Publishing Group, 2020), paper FW5D.2.

Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2.

Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020.9252280.

B. Peng et al., "A CMOS Compatible Monolithic Fiber Attach Solution with Reliable Performance and Self-alignment," in Optical Fiber Communication Conference (OFC) 2020, OSA Technical Digest (Optica Publishing Group, 2020), paper Th3l.4.

Y. Bian et al., "Monolithically integrated silicon nitride platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper Th1A.46.

A. Aboketaf et al., "Towards fully automated testing and characterization for photonic compact modeling on 300-mm wafer platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper W6A.1.

A. Chowdhury et al., "High Performance Avalanche Photodiode in a Monolithic Silicon Photonics Technology," 2022 Optical Fiber Communications Conference and Exhibition (OFC), San Diego, CA, USA, 2022, pp. 1-3.

* cited by examiner

PHOTODETECTORS WITH A LIGHT-ABSORBING LAYER AT LEAST PARTIALLY WRAPPED ABOUT A WAVEGUIDE CORE

BACKGROUND

The disclosure relates to semiconductor device fabrication and integrated circuits and, more specifically, to structures including a photodetector and methods of forming a structure including a photodetector.

Photonics chips are used in many applications and systems including, but not limited to, data communication systems and data computation systems. A photonics chip includes a photonic integrated circuit comprised of optical components, such as modulators, polarizers, and optical couplers, that are used to manipulate light received from a light source.

Photonics chips may include photodetectors that convert light, which may be modulated as an optical signal, into an electrical signal. A photodetector may suffer from mode mismatch and significant back reflection due to a refractive index mismatch between the light-absorbing material of the photodetector and the material of a waveguide core supplying the light to the light-absorbing material. The mode mismatch and back reflection degrade the coupling efficiency of light to the photodetector.

Improved structures including a photodetector and methods of forming a structure including a photodetector are needed.

SUMMARY

In an embodiment of the invention, a structure comprises a semiconductor layer comprising a crystalline semiconductor material, a waveguide core including a first sidewall and a second sidewall, and a photodetector including a light-absorbing layer, an anode, and a cathode. The light-absorbing layer includes a first portion and a second portion that are disposed on the semiconductor layer. The first portion of the light-absorbing layer is adjacent to the first sidewall of the waveguide core, and the second portion of the light-absorbing layer is adjacent to the second sidewall of the waveguide core.

In an embodiment of the invention, a structure comprises a photodetector including a semiconductor layer having a cavity, an anode, and a cathode. The anode includes a first doped region in the semiconductor layer adjacent to the cavity, and the cathode includes a second doped region in the semiconductor layer adjacent to the cavity. The structure further comprises a waveguide core disposed over the cavity in the semiconductor layer. The waveguide core includes a first sidewall adjacent to the first doped region and a second sidewall adjacent to the second doped region.

In an embodiment of the invention, a method comprises forming an anode of a photodetector, forming a cathode of the photodetector, forming a waveguide core that includes a first sidewall and a second sidewall, and forming a light-absorbing layer of the photodetector. The light-absorbing layer includes a first portion and a second portion that are disposed on a semiconductor layer, the semiconductor layer comprises a crystalline semiconductor material, the first portion of the light-absorbing layer is adjacent to the first sidewall of the waveguide core, and the second portion of the light-absorbing layer is adjacent to the second sidewall of the waveguide core.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
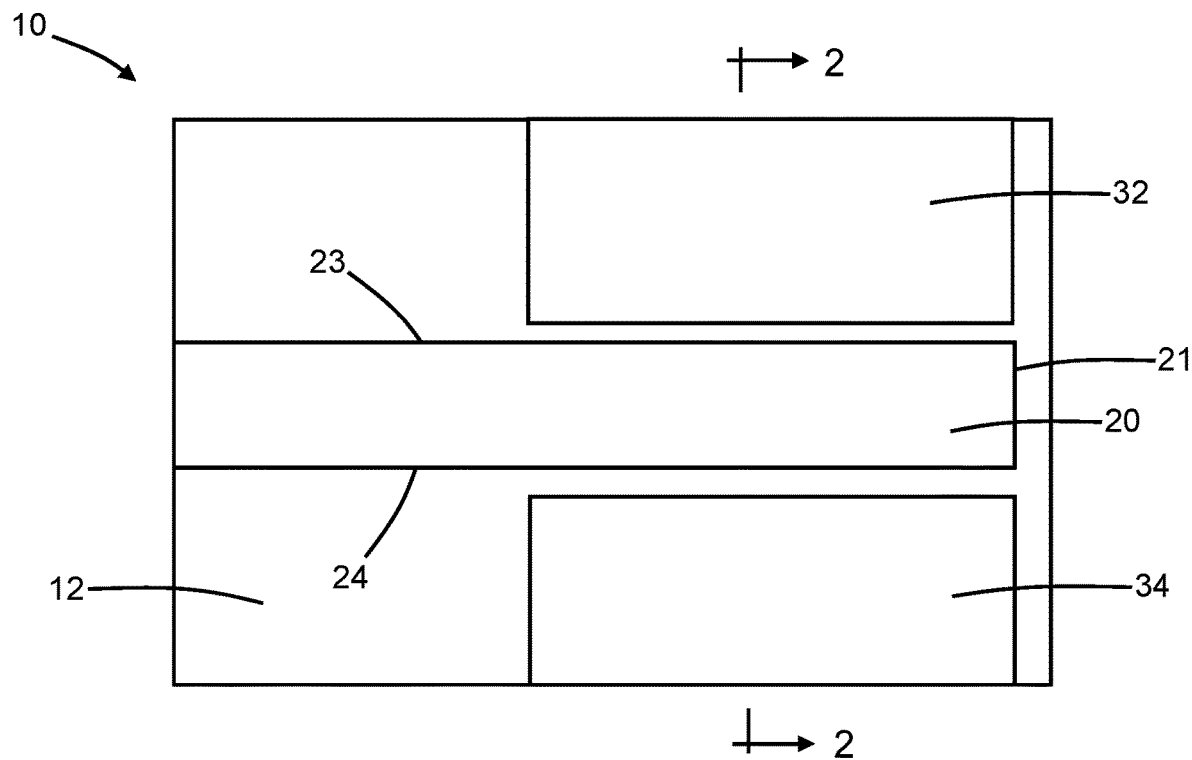
FIG. 1 is a top view of a structure at an initial fabrication stage of a processing method in accordance with embodiments of the invention.
Figure 2:
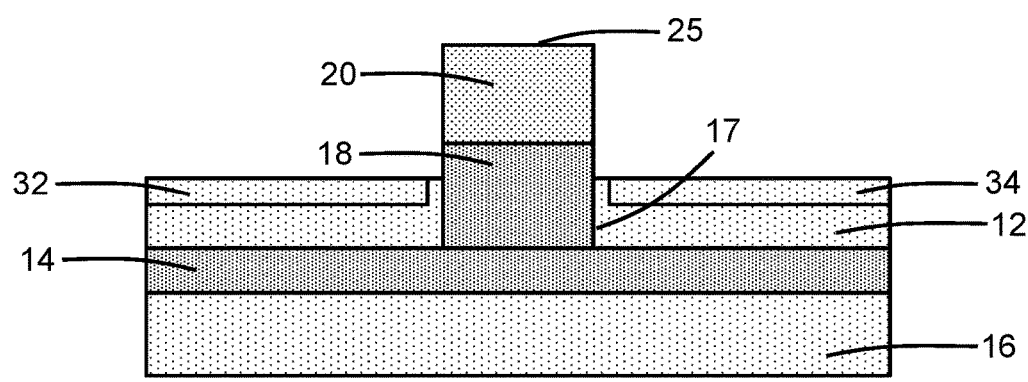
FIG. 2 is a cross-sectional view taken generally along line 2-2 in FIG. 1.

With reference to FIGS. 1, 2 and in accordance with embodiments of the invention, a structure 10 includes a device layer 12 that is positioned on, and above, a dielectric layer 14 and a semiconductor substrate 16. In an embodiment, the device layer 12 may be comprised of a crystalline semiconductor material, such as single-crystal silicon. In an embodiment, the dielectric layer 14 may be comprised of a dielectric material, such as silicon dioxide, and the semiconductor substrate 16 may be comprised of a crystalline semiconductor material, such as single-crystal silicon. In an embodiment, the dielectric layer 14 may be a buried oxide layer of a silicon-on-insulator substrate, and the buried oxide layer may separate the crystalline semiconductor material of the device layer 12 from the semiconductor substrate 16.

A cavity 17 is patterned by lithography and etching processes in the device layer 12. In an embodiment, the cavity 17 may penetrate fully through the device layer 12 to the dielectric layer 14. A dielectric layer 18 is deposited, and a waveguide core 20 is formed on the dielectric layer 18. In an embodiment, the waveguide core 20 may be formed by depositing a layer of its constituent material on the dielectric layer 18 and patterning the layer with lithography and etching processes. The waveguide core 20 includes a sidewall 23 and a sidewall 24 that is opposite to the sidewall 23.

The waveguide core 20 terminates at an end defined by a sidewall 21 that connects the sidewall 23 to the sidewall 24.

The dielectric layer 18 may be patterned by lithography and etching processes using the waveguide core 20 as an etch mask. The patterning of the dielectric layer 18 may be self-aligned to the waveguide core 20, and the patterned portion of the dielectric layer 18 may be located inside the cavity 17 and on the dielectric layer 14. The thickness of the dielectric layer 18 may be greater than the thickness of the device layer 12 such that the waveguide core 20 is elevated above a top surface of the device layer 12.

In an embodiment, the dielectric layer 18 may be comprised of a dielectric material, such as silicon dioxide. In an embodiment, the waveguide core 20 may be comprised of a material having a refractive index that is greater than the refractive index of silicon dioxide. In an embodiment, the waveguide core 20 may be comprised of a dielectric material, such as silicon nitride, silicon oxynitride, aluminum nitride, or aluminum oxide. In an embodiment, the waveguide core 20 may be comprised of a semiconductor material, such as polysilicon. In an embodiment, other materials, such as a III-V compound semiconductor, may be used to form the waveguide core 20.

A doped region 32 and a doped region 34 may be formed in respective portions of the device layer 12 that are adjacent to the cavity 17. The waveguide core 20 is positioned in a lateral direction between the doped region 32 and the doped region 34. The doped region 32 may be arranged adjacent to the sidewall 23 of the waveguide core 20 to define an anode of the photodetector, and the doped region 34 may be arranged adjacent to the sidewall 24 of the waveguide core 20 to define a cathode of the photodetector.

The doped region 32 may be formed by, for example, ion implantation with an implantation mask having an opening that determines an implanted portion of the device layer 12. The implantation mask may include a layer of photoresist applied by a spin-coating process, pre-baked, exposed to light projected through a photomask, baked after exposure, and developed with a chemical developer to define the opening over the area to be implanted. The implantation conditions (e.g., ion species, dose, kinetic energy) may be selected to tune the electrical and physical characteristics of the doped region 32. The implantation mask may be stripped after forming the doped region 32. In an embodiment, the semiconductor material of the doped region 32 may contain a p-type dopant (e.g., boron) that provides p-type electrical conductivity.

The doped region 34 may be formed by, for example, ion implantation with an implantation mask with an opening that determines an implanted portion of the device layer 12. The implantation mask may include a layer of photoresist applied by a spin-coating process, pre-baked, exposed to light projected through a photomask, baked after exposure, and developed with a chemical developer to define the opening over the area to be implanted. The implantation conditions (e.g., ion species, dose, kinetic energy) may be selected to tune the electrical and physical characteristics of the doped region 34. The implantation mask may be stripped after forming the doped region 34. In an embodiment, the semiconductor material of the doped region 34 may contain an n-type dopant (e.g., phosphorus and/or arsenic) that provides n-type electrical conductivity.

Figure 3:
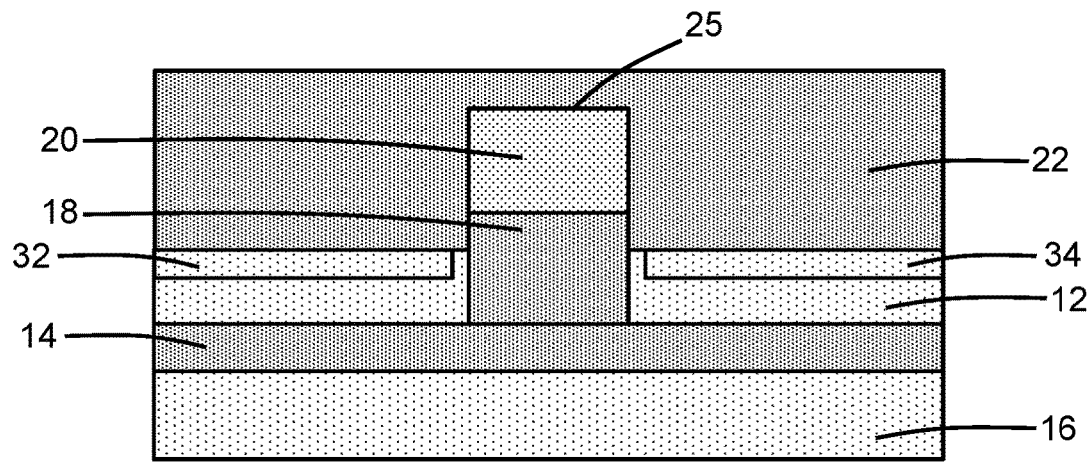
FIG. 3 is a cross-sectional view of the structure at a fabrication stage subsequent to FIGS. 1, 2.

With reference to FIG. 3 in which like reference numerals refer to like features in FIG. 2 and at a subsequent fabrication stage, a dielectric layer 22 may be formed over the waveguide core 20. The dielectric layer 22 may be comprised of a dielectric material, such as silicon dioxide, having a lower refractive index than the material constituting the waveguide core 20. The waveguide core 20 is embedded in the dielectric layer 22, which may be deposited and planarized following deposition.

Figure 4:
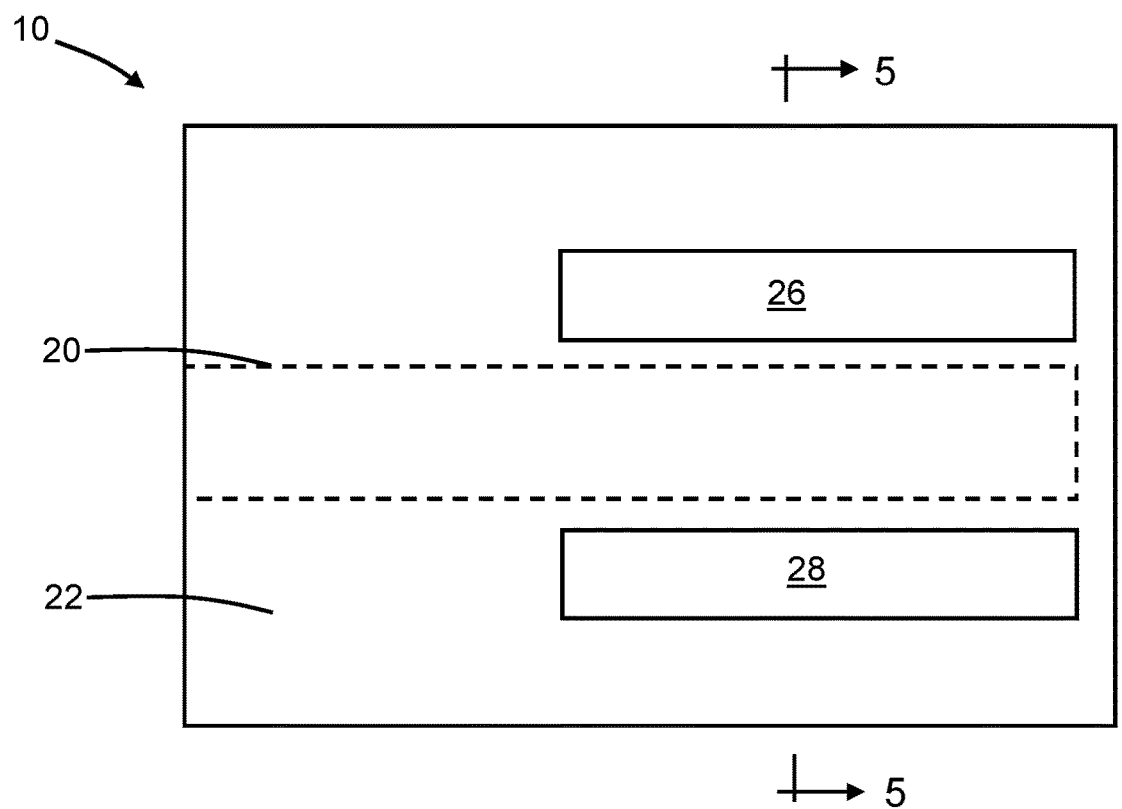
FIG. 4 is a top view of the structure at a fabrication stage subsequent to FIG. 3.
Figure 5:
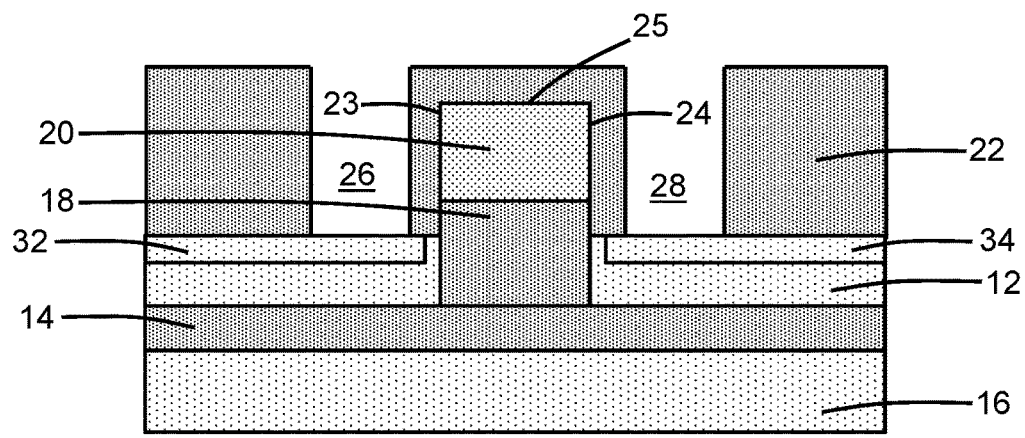
FIG. 5 is a cross-sectional view taken generally along line 5-5 in FIG. 4.

With reference to FIGS. 4, 5 in which like reference numerals refer to like features in FIG. 3 and at a subsequent fabrication stage, trenches 26, 28 may be patterned in the dielectric layer 22 by lithography and etching processes. The dielectric layer 18 and waveguide core 20 are disposed in a lateral direction between the trench 26 and the trench 28. The trench 26 is disposed adjacent to the sidewall 23 of the waveguide core 20, and the trench 28 is disposed adjacent to the sidewall 24 of the waveguide core 20. In an embodiment, the trenches 26, 28 may fully extend to the device layer 12 such that respective surface areas of the device layer 12 are revealed. In an embodiment, a portion of the dielectric layer 22 may be disposed between the trench 26 and the sidewall 23 of the waveguide core 20, another portion of the dielectric layer 22 may be disposed between the trench 28 and the sidewall 24 of the waveguide core 20, and another portion of the dielectric layer 22 may be disposed over a top surface 25 of the waveguide core 20 such that the waveguide core 20 is surrounded by the dielectric material of the dielectric layer 22 after the trenches 26, 28 are formed.

Figure 6:
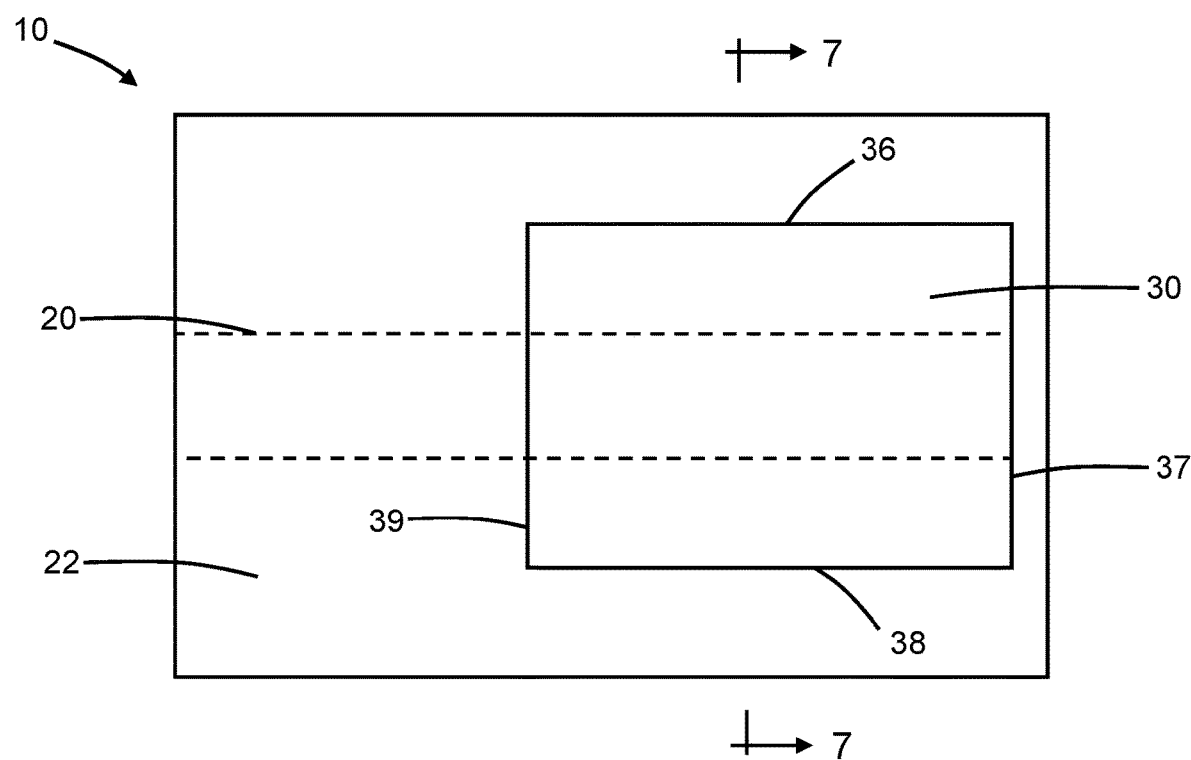
FIG. 6 is a top view of the structure at a fabrication stage subsequent to FIG. 4.
Figure 7:
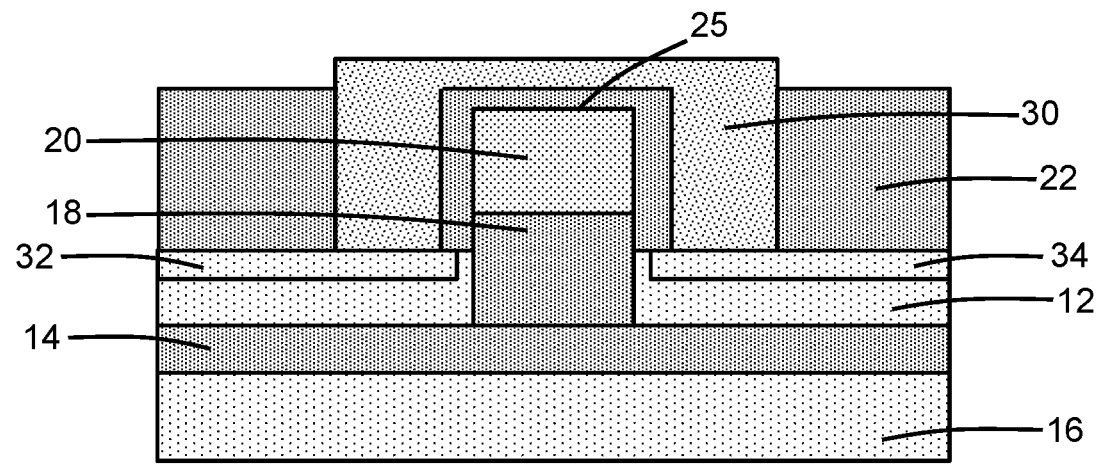
FIG. 7 is a cross-sectional view taken generally along line 7-7 in FIG. 6.

With reference to FIGS. 6, 7 in which like reference numerals refer to like features in FIGS. 4, 5 and at a subsequent fabrication stage, a light-absorbing layer 30 of the photodetector may be formed that includes a portion disposed in the trench 26 adjacent to the sidewall 23 of the waveguide core 20, a portion disposed in the trench 28 adjacent to the sidewall 24 of the waveguide core 20, and a portion that is disposed over the top surface 25 the waveguide core 20. The light-absorbing layer 30 includes a sidewall 36 adjacent to the sidewall 23 of the waveguide core 20, a sidewall 38 opposite to the sidewall 36 and adjacent to the sidewall 24 of the waveguide core 20, a sidewall 37 adjacent to the sidewall 21 at the end of the waveguide core 20, and a sidewall 39 opposite to the sidewall 37. The portion of the light-absorbing layer 30 disposed over the top surface 25 of the waveguide core 20 defines a bridge extending over the waveguide core 20 to connect the portions of the light-absorbing layer 30 in the trenches 26, 28. As a result of the arrangement of its different portions, the light-absorbing layer 30 may wrap around a portion of the waveguide core 20 arranged adjacent to the sidewall 21 at the end of the waveguide core 20.

The light-absorbing layer 30 is positioned in a lateral direction between the doped region 32 and the doped region 34. In an embodiment, the portion of the light-absorbing layer 30 in the trench 26 may overlap with a portion of the device layer 12 including the doped region 32, and the portion of the light-absorbing layer 30 in the trench 28 may overlap with a portion of device layer 12 including the doped region 34. In an embodiment, the portion of the light-absorbing layer 30 in the trench 26 may adjoin the portion of the device layer 12 including the doped region 32, and the portion of the light-absorbing layer 30 in the trench 28 may adjoin the portion of the device layer 12 including the doped region 34. In an embodiment, the portion of the light-absorbing layer 30 in the trench 26 may be in direct contact with the portion of the device layer 12 including the doped region 32, and the portion of the light-absorbing layer 30 in the trench 28 may be in direct contact with the portion of the device layer 12 including the doped region 34. Portions of the doped regions 32, 34, which are not overlapped by the light-absorbing layer 30, are revealed adjacent to the sidewalls 36, 38 of the light-absorbing layer 30 and enable the subsequent formation of contacts coupled to the anode and cathode of the photodetector.

The light-absorbing layer 30 may be comprised of a semiconductor material that is epitaxially grown from the areas of the device layer 12 revealed inside the trenches 26, 28 and then planarized by, for example, chemical-mechanical polishing. In an embodiment, the light-absorbing layer 30 may be arranged fully above the device layer 12. The dielectric material of the dielectric layer 22 may fully separate the light-absorbing layer 30 from the waveguide core 20. In an alternative embodiment, the light-absorbing layer 30 may contact the waveguide core 20 if portions of the dielectric layer 22 are not disposed about the waveguide core 20.

The light-absorbing layer 30 may be comprised of a material that generates charge carriers from absorbed light by the photoelectric effect. In an embodiment, the light-absorbing layer 30 may be comprised of germanium. In an embodiment, the light-absorbing layer 30 may be comprised of intrinsic germanium.

Figure 8:
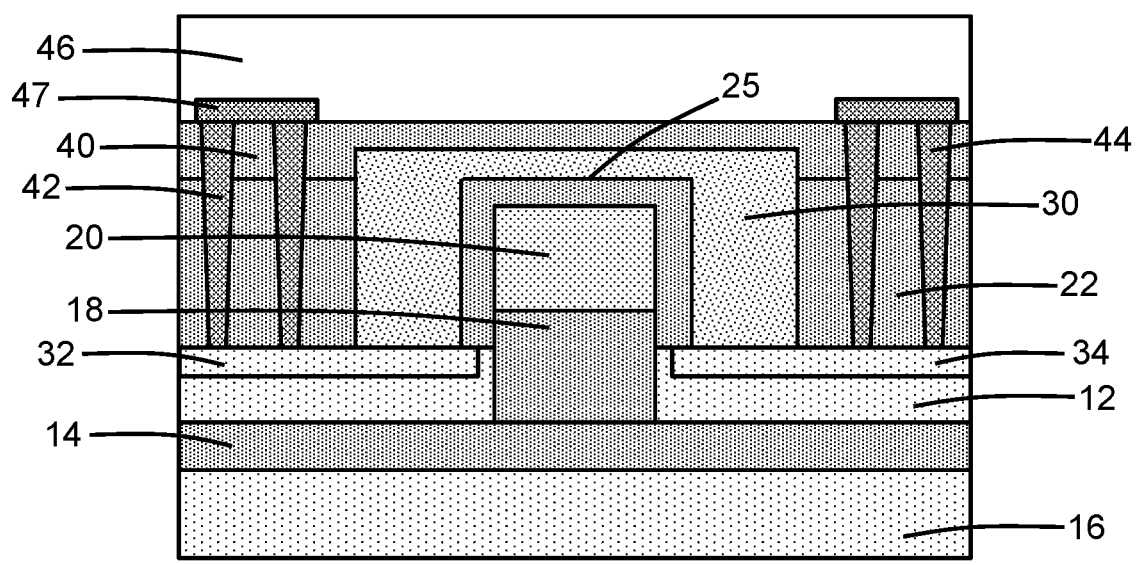
FIG. 8 is a cross-sectional view of the structure at a fabrication stage subsequent to FIGS. 6, 7.

With reference to FIG. 8 in which like reference numerals refer to like features in FIGS. 6, 7 and at a subsequent fabrication stage, a dielectric layer 40 may be formed over the light-absorbing layer 30. The dielectric layer 40 may be comprised of a dielectric material, such as silicon dioxide, having a lower refractive index than the dielectric material constituting the light-absorbing layer 30. An upper portion of the light-absorbing layer 30 may be embedded in the dielectric layer 40, which may be deposited and planarized following deposition. The dielectric layers 22, 40 provide low-index cladding for the light-absorbing layer 30.

Contacts 42 may be formed in the dielectric layers 22, 40 that land on the doped region 32, and contacts 44 may be formed in the dielectric layers 22, 40 that land on the doped region 34. Heavily-doped regions (not shown) of the same conductivity types as the doped regions 32, 34 may be formed in the doped regions 32, 34 to provide a reduced contact resistance to the contacts 42, 44. The contacts 42, 44 may be comprised of a metal, such as tungsten.

A back-end-of-line stack 46 may be formed over the dielectric layer 40. The back-end-of-line stack 46 may include interlayer dielectric layers comprised of a dielectric material, such as silicon dioxide, tetraethylorthosilicate silicon dioxide, fluorinated-tetraethylorthosilicate silicon dioxide, or nitrogen-doped silicon carbide, that is an electrical insulator. The contacts 42, 44 may be coupled to metal interconnects 47 included in the back-end-of-line stack 46.

In use, light (e.g., infrared laser light) propagating in the waveguide core 20 is coupled from the waveguide core 20 to the light-absorbing layer 30 of the photodetector. The light-absorbing layer 30 absorbs photons of the light and converts the absorbed photons into charge carriers. Biasing of the doped regions 32, 34 causes the charge carriers to be collected and output to provide, as a function of time, a measurable photocurrent.

The photodetector may exhibit an improved absorption due, at least in part, to enhanced light coupling enabled by the wrapping of the light-absorbing layer 30 about the exterior sidewalls 23, 24 and top surface 25 of the waveguide core 20. The photodetector may also exhibit reduced back reflection and scattering into the low-index cladding surrounding the waveguide core 20 and light-absorbing layer 30 because of an improved mode match.

Figure 9:
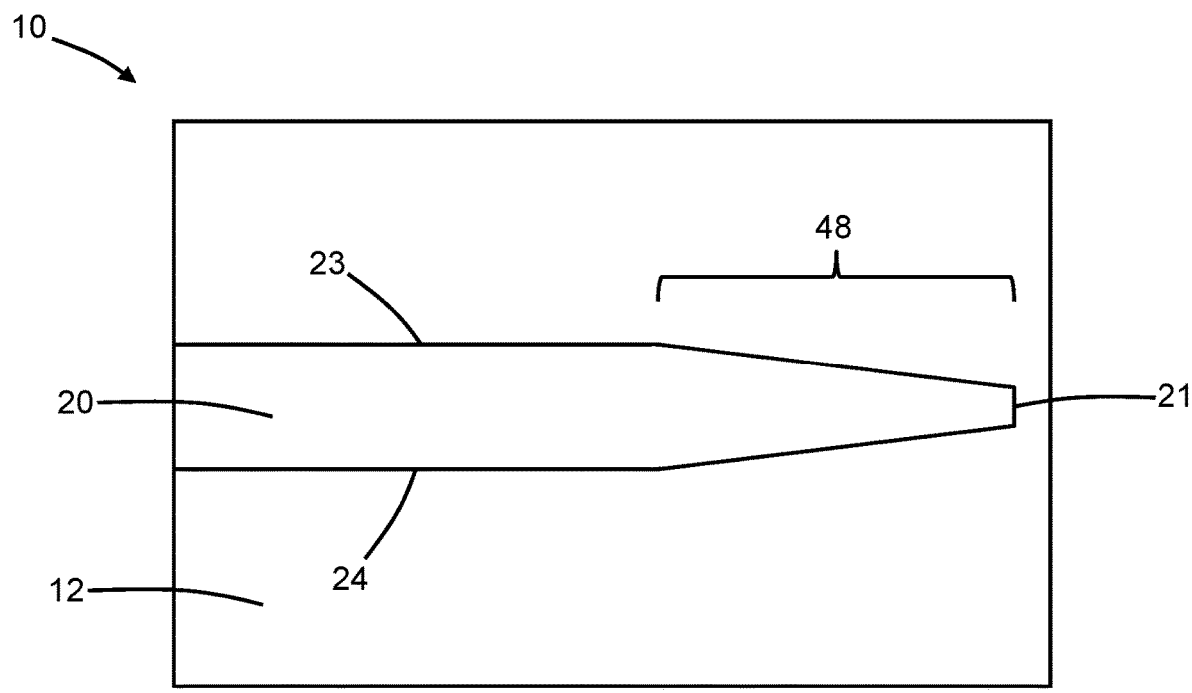
FIG. 9 is a top view of a structure in accordance with alternative embodiments of the invention.

With reference to FIG. 9 and in accordance with alternative embodiments, the waveguide core 20 may be modified to include a tapered section 48. The tapered section 48 may terminate at the sidewall 21 at the end of the waveguide core 20. The tapered section 48 has a width dimension that may increase with increasing distance from the sidewall 21. In an embodiment, the width dimension of the tapered section 48 may increase linearly with increasing distance from the sidewall 21 at the end of the waveguide core 20. In an alternative embodiment, the width dimension of the tapered section 48 may vary based on a non-linear function, such as a quadratic function, a cubic function, a parabolic function, a sine function, a cosine function, a Bezier function, or an exponential function. In an embodiment, the tapered section 48 may include a single stage of tapering characterized by a taper angle. In an alternative embodiment, the tapered section 48 may taper in multiple stages each characterized by a different taper angle.

The light-absorbing layer 30 is subsequently formed and wraps about at least a portion of the tapered section 48 of the waveguide core 20 as shown in FIGS. 6, 7. The tapering of the tapered section 48 of the waveguide core 20 may further reduce mode mismatch and back reflection.

Figure 10:
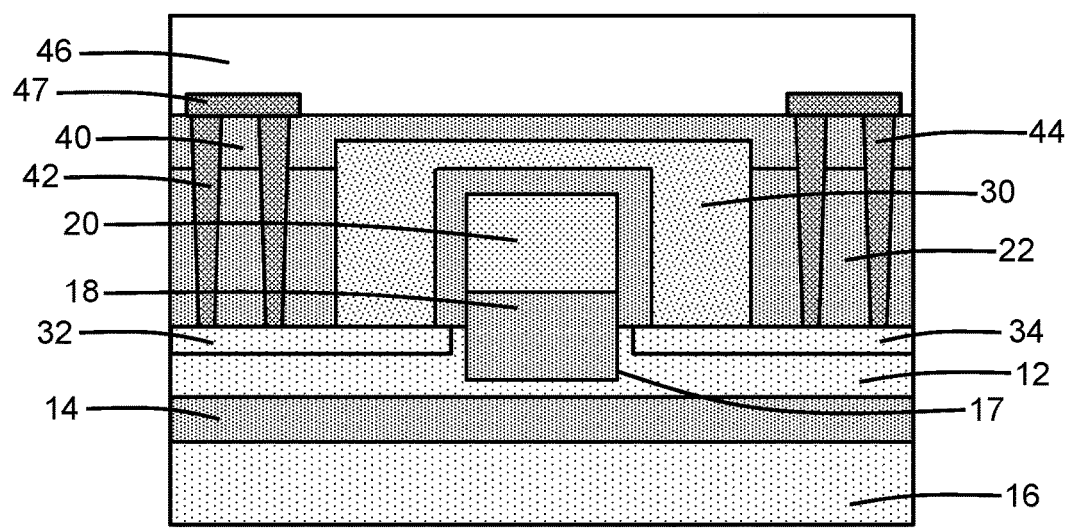
FIG. 10 is a cross-sectional view of a structure in accordance with alternative embodiments of the invention.

With reference to FIG. 10 and in accordance with alternative embodiments, the cavity 17 may be patterned to only penetrate partially through the device layer 12. As a result, a portion of the device layer 12 may be disposed between the dielectric layer 14 and the dielectric layer 18.

Figure 11:
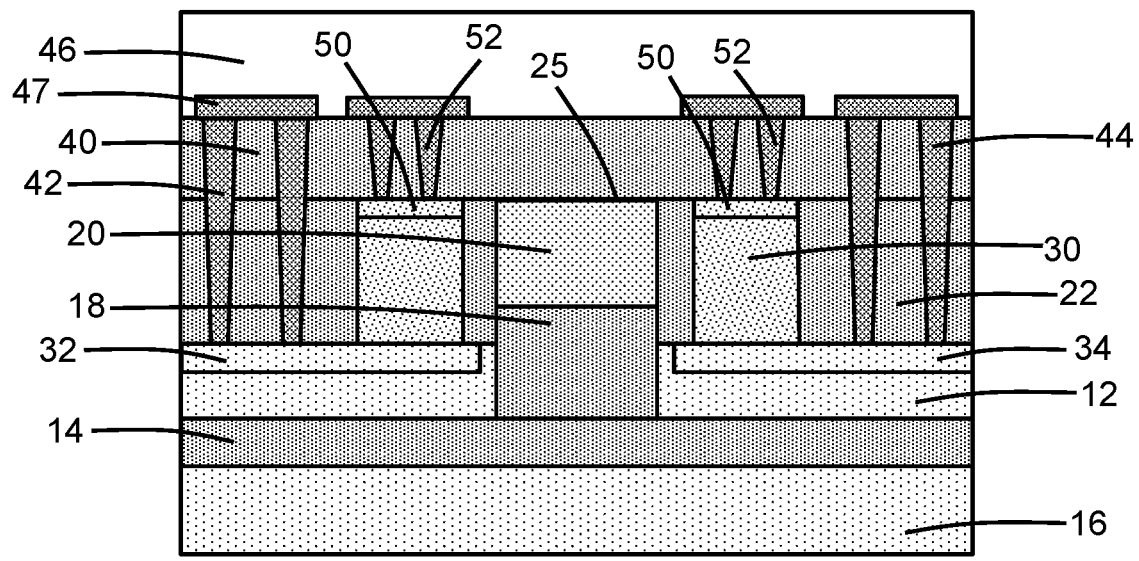
FIG. 11 is a cross-sectional view of a structure in accordance with alternative embodiments of the invention.

With reference to FIG. 11 and in accordance with alternative embodiments, the portion of the light-absorbing layer 30 over the waveguide core 20 may be eliminated such that the light-absorbing layer 30 lacks a portion that bridges over the waveguide core 20. Disconnected portions of the light-absorbing layer 30 are disposed in the trench 26 adjacent to the sidewall 23 of the waveguide core 20 and in the trench 28 adjacent to the sidewall 24 of the waveguide core 20. Doped regions 50 may be formed in an upper region of the portions of the light-absorbing layer 30 in the trenches 26, 28, and contacts 52 may be formed in the dielectric layers 22, 40 that are coupled by the doped regions 50 to the upper regions of the portions of the light-absorbing layer 30 in the trenches 26, 28. The doped regions 32, 34 may be modified to have the same conductivity type, and the doped regions 50 may have a conductivity type that is opposite to the conductivity type of the doped regions 32, 34. In an embodiment, the doped regions 32, 34 may be characterized by p-type conductivity, and the doped regions 50 may be characterized by n-type conductivity.

Figure 12:
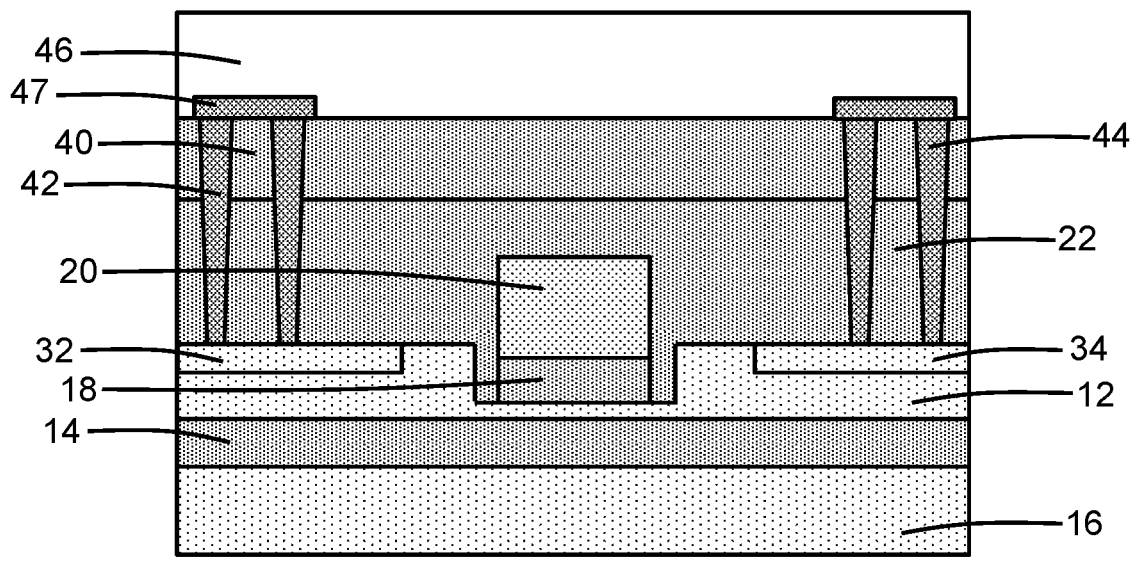
FIG. 12 is a cross-sectional view of a structure in accordance with alternative embodiments of the invention.

With reference to FIG. 12 and in accordance with alternative embodiments, the light-absorbing layer 30 may be eliminated and the photodetector may be configured to detect visible wavelengths of light guided by the waveguide core 20 to the photodetector. In that regard, the portion of the device layer 12 arranged between the doped region 32 and the doped region 34 may absorb photons and generate charge carriers.

The device layer 12 may partially surround the cavity 17 such that the device layer 12 wraps around a lower portion of the waveguide core 20. In that regard, a portion of the device layer 12 is arranged beneath the lower portion of the waveguide core 20 and is separated by the dielectric layer 18 from a lower surface of the waveguide core 20. The dielectric material of the dielectric layer 18 and the dielectric material of the dielectric layer 22 are disposed inside the cavity 17 in the device layer 12 and provide low-index cladding between the waveguide core 20 and the device layer 12. In an alternative embodiment, the device layer 12 may be comprised of single-crystal silicon-germanium instead of single-crystal silicon.

Figure 13:
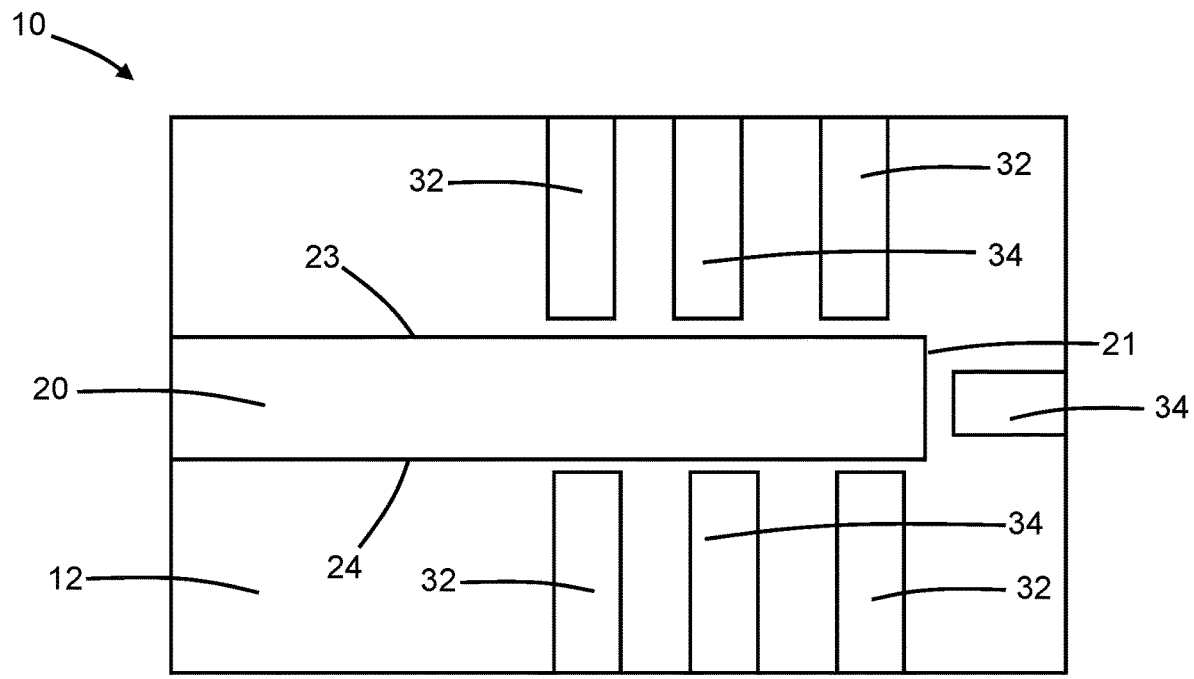
FIG. 13 is a top view of a structure in accordance with alternative embodiments of the invention.

With reference to FIG. 13 and in accordance with alternative embodiments, the structure 10 may be modified to include multiple doped regions 32 and multiple doped regions 34 that are arranged adjacent to the opposite sidewalls 23, 24 of the waveguide core 20 and the sidewall 21 at the end of the waveguide core 20. In an embodiment, the doped regions 32 and the doped regions 34 may alternate along the sidewalls 23, 24. In an embodiment, a pair of the doped regions 32 and one of the doped regions 34 may be arranged adjacent to each of the sidewalls 23, 24 and one of the doped regions 34 may be arranged adjacent to the sidewall 21 at the end of the waveguide core 20. In alternative embodiments, the number and locations of the doped regions 32 may be varied and/or the number and locations of the doped regions 34 may be varied. The doped regions 32 adjacent to the sidewall 23 may be aligned with respective doped regions 32 adjacent to the sidewall 24, and the doped region 34 adjacent to the sidewall 23 may be aligned with the doped region 34 adjacent to the sidewall 24.

Processing continues, as described hereinabove, to complete the structure 10, which includes forming the light-absorbing layer 30 that is wrapped about a portion of the waveguide core 20, forming the contacts 42 coupled to the doped regions 32, and forming the contacts 44 coupled to the doped regions 34.

Figure 14:
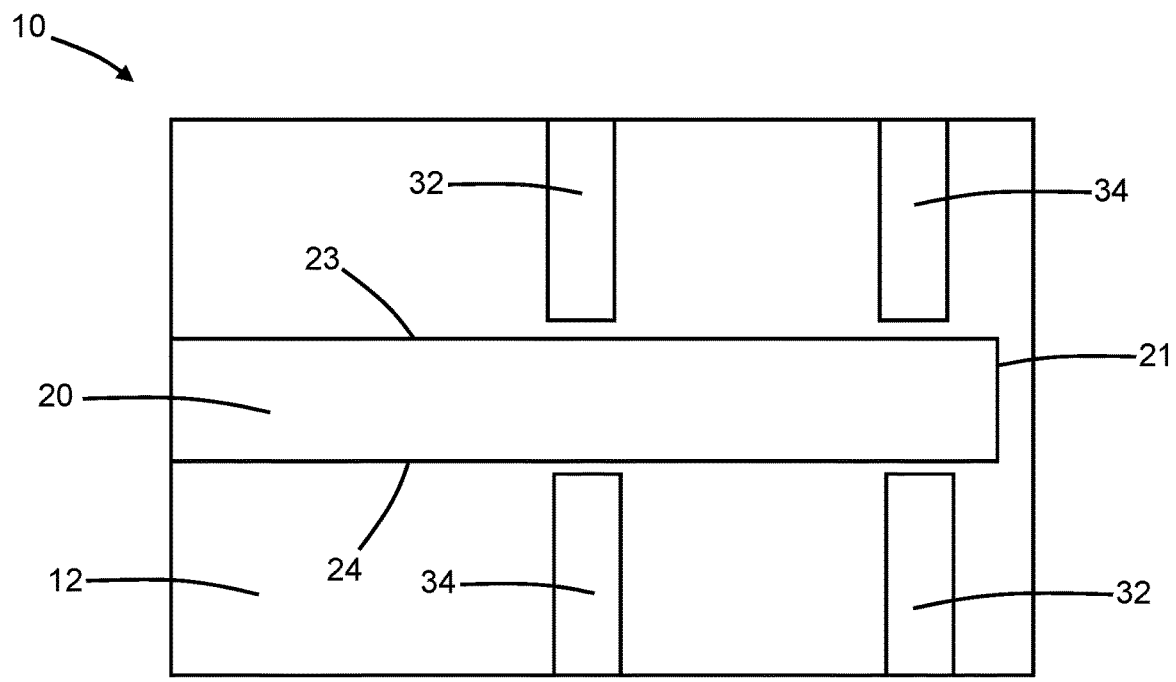
FIG. 14 is a top view of a structure in accordance with alternative embodiments of the invention.

With reference to FIG. 14 in which like reference numerals refer to like features in FIG. 13 and in accordance with alternative embodiments, the doped regions 32 and doped regions 34 may have a different arrangement adjacent to the opposite sidewalls 23, 24 of the waveguide core 20. In an embodiment, the doped region 32 adjacent to the sidewall 23 may be aligned with the doped region 34 adjacent to the sidewall 24, and the doped region 34 adjacent to the sidewall 23 may be aligned with the doped region 32 adjacent to the sidewall 24. In alternative embodiments, the number and locations of the doped regions 32 may be varied and/or the number and locations of the doped regions 34 may be varied.

Processing continues, as described hereinabove, to complete the structure 10, which includes forming the light-absorbing layer 30 that is wrapped about a portion of the waveguide core 20, forming the contacts 42 coupled to the doped regions 32, and forming the contacts 44 coupled to the doped regions 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor layer comprising a crystalline semiconductor material;
a waveguide core including a first sidewall and a second sidewall, the waveguide core comprising a first dielectric material;
a photodetector including a light-absorbing layer, an anode including a first doped region in a first portion of the semiconductor layer, and a cathode including a second doped region in a second portion of the semiconductor layer, the light-absorbing layer including a first portion and a second portion that are disposed on the semiconductor layer, the first portion of the light-absorbing layer adjacent to the first sidewall of the waveguide core, and the second portion of the light-absorbing layer adjacent to the second sidewall of the waveguide core; and
a dielectric layer including a first portion and a second portion, the dielectric layer comprising a second dielectric material having a lower refractive index than the first dielectric material, the first portion of the dielectric layer disposed between the first sidewall of the waveguide core and the first portion of the light-absorbing layer, and the second portion of the dielectric layer disposed between the second sidewall of the waveguide core and the second portion of the light-absorbing layer.

2. The structure of claim 1 wherein the waveguide core includes a top surface, and the light-absorbing layer includes a third portion over the top surface of the waveguide core.

3. The structure of claim 2 wherein the third portion of the light-absorbing layer extends across the top surface of a portion of the waveguide core to connect the first portion of the light-absorbing layer to the second portion of the light-absorbing layer.

4. The structure of claim 1 wherein the light-absorbing layer comprises germanium, and the first dielectric material comprises silicon nitride.

5. The structure of claim 1 wherein the light-absorbing layer comprises intrinsic germanium, and the first dielectric material comprises silicon nitride.

6. The structure of claim 1 wherein the first portion of the light-absorbing layer adjoins a first portion of the semiconductor layer adjacent to the first sidewall, and the second portion of the light-absorbing layer adjoins a second portion of the semiconductor layer adjacent to the second sidewall.

7. The structure of claim 6 wherein the first portion of the semiconductor layer includes the first doped region, and the second portion of the semiconductor layer includes the second doped region.

8. The structure of claim 1 wherein the first doped region and the second doped region have opposite conductivity types.

9. The structure of claim 1 wherein the waveguide core has a top surface, the first portion of the light-absorbing layer extends from the semiconductor layer to the top surface of the waveguide core, and the second portion of the light-absorbing layer extends from the semiconductor layer to the top surface of the waveguide core.

10. The structure of claim 1 further comprising:
a cavity in the semiconductor layer; and
a first dielectric layer in the cavity,
wherein the waveguide core is disposed on the first dielectric layer.

11. The structure of claim 10 wherein the cavity extends partially through the semiconductor layer.

12. The structure of claim 10 further comprising:
a second dielectric layer,
wherein the semiconductor layer is disposed on the second dielectric layer, and the cavity extends fully through the semiconductor layer to the second dielectric layer.

13. The structure of claim 1 wherein the waveguide core includes a tapered section, and the light-absorbing layer overlaps with the tapered section of the waveguide core.

14. A method comprising:
forming an anode of a photodetector, wherein the anode includes a first doped region in a first portion of a semiconductor layer;

forming a cathode of the photodetector, wherein the cathode includes a second doped region in a second portion of the semiconductor layer;

forming a waveguide core that includes a first sidewall and a second sidewall, wherein the waveguide core comprises a first dielectric material;

forming a light-absorbing layer of the photodetector, wherein the light-absorbing layer includes a first portion and a second portion that are disposed on the semiconductor layer, the semiconductor layer comprises a crystalline semiconductor material, the first portion of the light-absorbing layer is adjacent to the first sidewall of the waveguide core, and the second portion of the light-absorbing layer is adjacent to the second sidewall of the waveguide core; and forming a dielectric layer including a first portion and a second portion, wherein the dielectric layer comprises a second dielectric material having a lower refractive index than the first dielectric material, the first portion of the dielectric layer is disposed between the first sidewall of the waveguide core and the first portion of the light-absorbing layer, and the second portion of the dielectric layer is disposed between the second sidewall of the waveguide core and the second portion of the light-absorbing layer.

15. The method of claim 14 wherein the first portion and the second portion of the light-absorbing layer are epitaxially grown from the semiconductor layer.

16. The structure of claim 1 wherein the first dielectric material comprises silicon nitride, silicon oxynitride, aluminum nitride, or aluminum oxide.

17. The structure of claim 16 wherein the second dielectric material comprises silicon dioxide.

18. The structure of claim 1 wherein the second dielectric material comprises silicon dioxide.

19. The structure of claim 10 wherein the semiconductor layer has a top surface, the first dielectric layer is thicker than the semiconductor layer, and the waveguide core is elevated above the top surface.

20. The method of claim 14 wherein the first dielectric material comprises silicon nitride, silicon oxynitride, aluminum nitride, or aluminum oxide, and the second dielectric material comprises silicon dioxide.

* * * * *